United States Patent
Jo et al.

(10) Patent No.: US 12,376,440 B2
(45) Date of Patent: Jul. 29, 2025

(54) MOTHER SUBSTRATE FOR DISPLAY PANEL, DISPLAY PANEL USING THE SAME

(71) Applicant: LG Display Co., Ltd., Seoul (KR)

(72) Inventors: Jun Young Jo, Paju-si (KR); Bung Goo Kim, Paju-si (KR); Hyoung Ho Ahn, Paju-si (KR); Hee Won Lee, Paju-si (KR); Hye Sun Jung, Paju-si (KR); Sang Hak Shin, Paju-si (KR); Jae Kwang Lee, Paju-si (KR); Hyoung Sun Park, Paju-si (KR); Pyung Ho Choi, Paju-si (KR); Tae Yoon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/676,118

(22) Filed: May 28, 2024

(65) Prior Publication Data
US 2025/0023000 A1    Jan. 16, 2025

(30) Foreign Application Priority Data
Jul. 12, 2023    (KR) .................. 10-2023-0090201

(51) Int. Cl.
*H10H 20/857*    (2025.01)
*H01L 25/075*    (2006.01)
*H10D 89/60*    (2025.01)

(52) U.S. Cl.
CPC ....... *H10H 20/857* (2025.01); *H01L 25/0753* (2013.01); *H10D 89/60* (2025.01)

(58) Field of Classification Search
CPC ... H10H 20/857; H10D 89/60; H01L 25/0753
See application file for complete search history.

(56) References Cited

U.S. PATENT DOCUMENTS

| | | | | |
|---|---|---|---|---|
| 6,338,986 B1 * | 1/2002 | Kawazoe | ............. | H10D 89/711 361/111 |
| 6,524,893 B2 * | 2/2003 | Kawazoe | ............. | H10D 84/135 257/357 |
| 6,696,730 B2 * | 2/2004 | Kawazoe | ............... | H10D 89/60 257/365 |
| 8,269,905 B2 * | 9/2012 | Hiromasu | ............. | H10D 89/60 349/40 |

(Continued)

FOREIGN PATENT DOCUMENTS

| | | |
|---|---|---|
| KR | 10-2021-0086292 A | 7/2021 |
| KR | 10-2022-0031842 A | 3/2022 |

(Continued)

*Primary Examiner* — Vinh T Lam
(74) *Attorney, Agent, or Firm* — Fenwick & West LLP

(57) ABSTRACT

A mother substrate for a display panel and a display panel using the same are disclosed. The mother substrate comprises a plurality of display area including a plurality of light-emitting areas configured to receive light-emitting elements, a plurality of wirings, and a plurality of pads connected to the plurality of wirings; a conductive ring in a non-display area that surrounds the display area such that each of the display areas is surrounded by the conductive ring and electrically connected to the pads; a photoresist pattern covering the plurality of display areas and the non-display area; and a first metal layer covering the photoresist pattern. The conductive ring includes an electrostatic blocking area.

26 Claims, 13 Drawing Sheets

(56) References Cited

U.S. PATENT DOCUMENTS

| | | | |
|---|---|---|---|
| 9,318,475 B2* | 4/2016 | Bibl | H01L 25/167 |
| 9,450,147 B2* | 9/2016 | McGroddy | H01L 24/95 |
| 9,455,242 B2* | 9/2016 | Wang | H10F 71/139 |
| 9,583,466 B2* | 2/2017 | McGroddy | H01L 25/0753 |
| 9,583,533 B2* | 2/2017 | Hu | H01L 24/83 |
| 9,768,345 B2* | 9/2017 | Hu | H10H 20/835 |
| 10,304,811 B2* | 5/2019 | Zhang | H01L 25/50 |
| 10,367,128 B2* | 7/2019 | Li | H10H 20/856 |
| 10,910,356 B2* | 2/2021 | Zhang | H01L 25/0753 |
| 11,309,457 B2* | 4/2022 | Jeon | H10H 20/815 |
| 11,374,031 B2* | 6/2022 | Long | H10D 86/0212 |
| 11,417,641 B2* | 8/2022 | Zhang | H10H 20/852 |
| 11,665,925 B2 | 5/2023 | Kim et al. | |
| 11,963,418 B2 | 4/2024 | Son et al. | |
| 12,068,264 B2* | 8/2024 | Zhai | H10H 20/855 |
| 2013/0119427 A1* | 5/2013 | Zhang | H10H 20/831 438/22 |
| 2014/0027709 A1* | 1/2014 | Higginson | H10D 86/0212 438/26 |
| 2017/0158815 A1* | 6/2017 | Hu | H10K 50/00 |
| 2018/0076182 A1* | 3/2018 | Wu | H01L 25/0753 |
| 2021/0202906 A1 | 7/2021 | Kim et al. | |
| 2022/0077278 A1 | 3/2022 | Son et al. | |
| 2022/0157917 A1 | 5/2022 | Park et al. | |
| 2022/0208945 A1 | 6/2022 | Lee et al. | |
| 2024/0096863 A1* | 3/2024 | Bai | H10H 20/01 |
| 2024/0272489 A1* | 8/2024 | Zhang | G02F 1/13394 |
| 2024/0413290 A1* | 12/2024 | Hu | H01L 25/075 |

FOREIGN PATENT DOCUMENTS

| | | |
|---|---|---|
| KR | 10-2022-0067647 A | 5/2022 |
| KR | 10-2022-0096887 A | 7/2022 |

* cited by examiner

MOTHER SUBSTRATE FOR DISPLAY PANEL, DISPLAY PANEL USING THE SAME

CROSS-REFERENCE TO RELATED APPLICATION

This application claims the benefit and priority to Republic of Korea Patent Application No. 10-2023-0090201, filed on Jul. 12, 2023, which is hereby incorporated by reference in its entirety.

TECHNICAL FIELD

The present disclosure relates to a mother substrate for a display panel and a display panel using the same.

DISCUSSION OF RELATED ART

Electroluminescent display devices may be roughly classified into organic light emitting display devices in which organic light emitting diodes (OLED) are disposed in pixels and inorganic light emitting display devices in which inorganic light emitting diodes (hereinafter referred to as "LED") are disposed in pixels.

Since electroluminescent display devices display images using self-luminous elements, they do not require a separate light source, such as a backlight unit, and can be implemented in thin and diverse forms. Electroluminescent display devices not only have excellent power consumption, response speed, luminance, and viewing angle, but also have excellent contrast ratio and color reproduction rate because they can express black gradations as complete black.

Organic light emitting display devices need to be designed to prevent or reduce penetration of oxygen and moisture because the penetration of moisture and oxygen can cause oxidation between the organic light emitting layer and the electrode.

As an example of inorganic light emitting display devices, micro-LED display devices in which micro-LEDs are disposed in pixels are attracting attention as a next-generation display device. The micro-LEDs may be inorganic LEDs having sizes of 100 μm or less. The micro-LEDs are manufactured through a separate semiconductor process, and transferred to the pixel location on the substrate for the display panel of the display device so that they can be disposed in each sub-pixel for each color.

The description provided in the background section should not be assumed to be prior art merely because it is mentioned in or associated with the background section. The background section may include information that describes one or more aspects of the subject technology.

SUMMARY

In the manufacturing process of the display panel, electrostatic discharge (ESD) may occur. The ESD may cause issues such as dielectric breakdown or short circuit between thin film layers of the display panel.

Therefore, the inventors of the present disclosure recognized the problems mentioned above and other limitations associated with the related art, and conducted various experiments to implement a mother substrate for a display panel and a display panel using the same that substantially obviate one or more of the issues due to limitations and disadvantages of the related art.

Accordingly, embodiments of the present disclosure are to provide a mother substrate for a display panel capable of blocking electrostatic discharge affecting the display panel and a display panel using the same.

Problems of the present disclosure are not limited to those mentioned above, and other problems not mentioned will be clearly understood by those skilled in the art from the following description.

In one embodiment, a mother substrate comprises: a plurality of display areas including a plurality of light-emitting areas configured to receive light-emitting elements, a plurality of wirings, and a plurality of pads connected to the plurality of wirings; a conductive ring in a non-display area that surrounds the plurality of display areas such that each of the plurality of display areas is surrounded by the conductive ring, the conductive ring electrically connected to the plurality of pads and including an electrostatic blocking area; a photoresist pattern covering the plurality of display areas and the non-display area; and a first metal layer covering the photoresist pattern, wherein the electrostatic blocking area includes a second metal layer that is spaced apart from the first metal layer with the photoresist pattern between the first metal layer and the second metal layer, and a light-emitting area from the plurality of light-emitting areas includes a third metal layer that is spaced apart from the first metal layer with the photoresist pattern between the first metal layer and the third metal layer, and wherein a first distance between the first metal layer and the second metal layer in the electrostatic blocking area is less than a second distance between the first metal layer and the third metal layer in the light-emitting area.

In one embodiment, a mother substrate comprises: a plurality of display areas including a plurality of light-emitting areas configured to receive light-emitting elements, a plurality of wirings, and a plurality of pads connected to the plurality of wirings; a conductive ring in a non-display area that surrounds the plurality of display areas such that each of the plurality of display areas is surrounded by the conductive ring, the conductive ring electrically connected to the plurality of pads and including an electrostatic blocking area; wherein the electrostatic blocking area includes a first metal layer electrically connected to a base voltage source or a power wiring, and a light-emitting area from the plurality of light-emitting areas includes a second metal layer on a same layer as the first metal layer, and a height of a lower surface of the first metal layer is higher than a height of a lower surface of the second metal layer.

In one embodiment, a mother substrate comprises: a display area including a plurality of light-emitting areas configured to receive light-emitting elements, a plurality of wirings, and a plurality of pads connected to the plurality of wirings; a conductive ring in a non-display area that is around the display area and connected to the plurality of pads, the conductive ring including an electrostatic blocking area; a photoresist pattern over the display area and the electrostatic blocking area, the photoresist pattern including a first portion of the photoresist pattern having a first opening in the electrostatic blocking area and a second portion of the photoresist pattern having a second opening in a light-emitting area of the plurality of light-emitting areas; a first metal layer including a first portion of the first metal layer over the electrostatic blocking area and a second portion of the first metal layer over the light-emitting area; a second metal layer in the first opening in the electrostatic blocking area; and a third metal layer in the second opening in the light-emitting area that is disconnected from the second metal layer, wherein the second metal layer is closer to the first portion of the first metal layer than the third metal layer is to the second portion of the first metal layer.

The display panel according to one embodiment of the present disclosure is separated from the mother substrate for the display panel and includes the display area without the photoresist pattern and the first metal layer.

In the present disclosure, the display panel and the conductive ring may be connected at an equi-potential on the mother substrate and an electrostatic blocking area including a capacitor formed with a small spacing between the metal layers may be disposed in the conductive ring to prevent or reduce display panel defects due to ESD caused in the manufacturing process of the display panel.

In the present disclosure, a yield of a display panel may be increased, a manufacturing process of the display panel may be optimized, and production energy may be reduced.

The effects of the present disclosure are not limited to those mentioned above, and other effects not mentioned will be clearly understood by those skilled in the art from the description of the claims.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that may be included to provide a further understanding of the disclosure and may be incorporated in and constitute a part of the disclosure, illustrate embodiments of the disclosure and together with the description serve to explain various principles of the disclosure.

The above and other objects, features, and advantages of the present disclosure will become more apparent to those of ordinary skill in the art by describing exemplary embodiments thereof in detail with reference to the attached drawings, in which.

Figure 1:
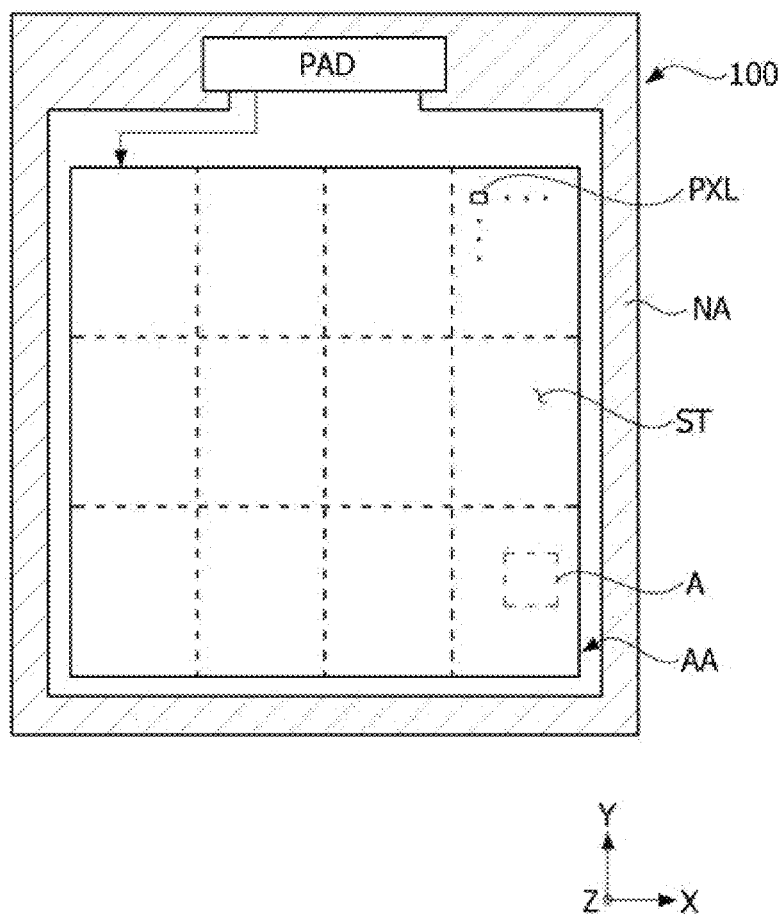
FIG. 1 is a diagram illustrating a display device according to one embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

The advantages and features of the present disclosure and methods for accomplishing the same will be more clearly understood from example embodiments described below with reference to the accompanying drawings. However, the present disclosure is not limited to the following example embodiments but may be implemented in various different forms. Rather, the present example embodiments will make the disclosure of the present disclosure complete and assist those skilled in the art to completely understand the scope of the present disclosure. The present disclosure is only defined within the scope of the accompanying claims.

The shapes, sizes, ratios, angles, numbers, and the like illustrated in the accompanying drawings for describing the various example embodiments of the present disclosure are merely given by way of examples, and the present disclosure is not limited thereto. Like reference numerals generally denote like elements throughout the present specification. Further, in describing the present disclosure, detailed descriptions of known related technologies may be omitted or briefly provided to avoid unnecessarily obscuring the subject matter of the present disclosure. Any implementation described herein as an "example" is not necessarily to be construed as preferred or advantageous over other implementations.

The terms such as "comprising", "including", "having", and "comprising" used herein are generally intended to allow other components to be added unless the terms are used with the term such as "only." An element described in the singular form is intended to include a plurality of elements, and vice versa, unless the context clearly indicates otherwise.

Components are interpreted to include an ordinary error range even if not expressly stated.

When a positional or interconnected relationship is described between two components, such as "on top of", "above", "below", "next to", "connect or couple with", "crossing", "intersecting", or the like, one or more other components may be interposed between them, unless "immediately", "directly" or "close(ly)" is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which a third structure is disposed or interposed therebetween. Furthermore, the terms "left," "right," "top," "bottom, "downward," "upward," "upper," "lower," and the like refer to an arbitrary frame of reference.

When a temporal antecedent relationship is described, such as "after", "following", "next to", "before", or the like, it may not be continuous on a time base unless "just", "immediately" or "directly" is used.

The terms "first," "second," "A," "B," "(a)," "(b)" and the like may be used to distinguish elements from each other, but the functions or structures of the components are not limited by ordinal numbers or component names in front of the components.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, various example embodiments of the present disclosure will be described in detail with reference to the accompanying drawings. Further, all the components of each mother substrate and each display panel according to all embodiments of the present disclosure are operatively coupled and configured. For convenience of description, a scale of each of elements illustrated in the accompanying drawings differs from a real scale, and thus, is not limited to a scale illustrated in the drawings.

A display device according to one embodiment of the present specification includes a display panel having a display area or screen on which an image is displayed, and a pixel driving circuit for driving pixels on the display panel. The display area includes a pixel area in which pixels are arranged. The pixel area includes a plurality of light emitting areas. A light emitting element is disposed in each of the light emitting areas. The pixel driving circuit may be built into the display panel.

Figure 2:
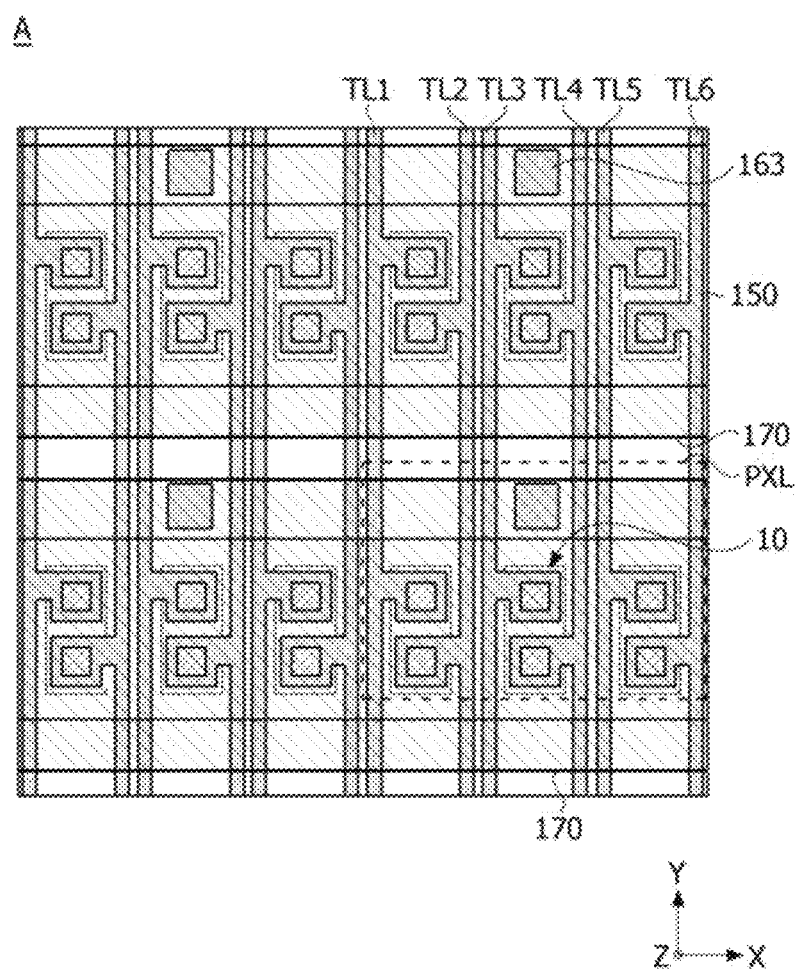
FIG. 2 is an enlarged view showing an area A of FIG. 1 according to an embodiment of the present disclosure.
Figure 3:
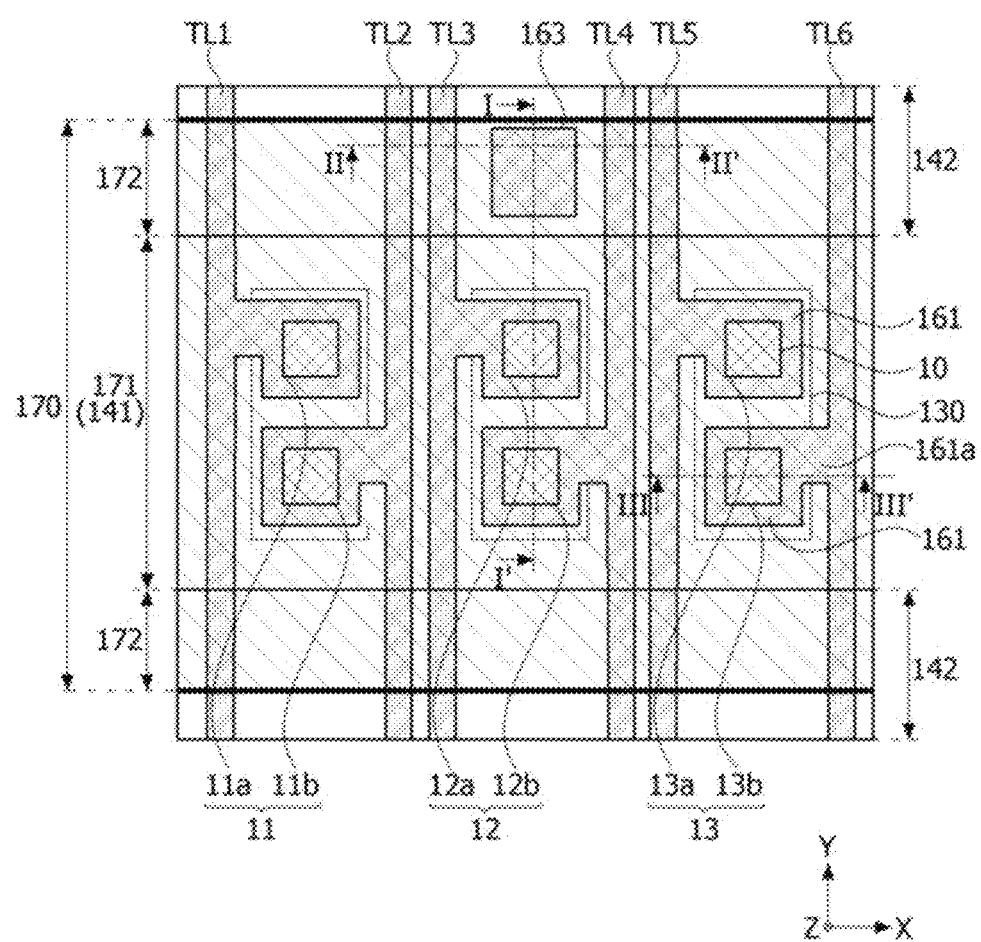
FIG. 3 is a diagram illustrating a partial area of a pixel according to an embodiment of the present disclosure.

FIG. 1 is a diagram illustrating a display device according to one embodiment of the present specification. FIG. 2 is an enlarged view of an area A of FIG. 1 according to one embodiment of the present specification. FIG. 3 is a diagram illustrating a partial area of a pixel according to one embodiment of the present specification.

Referring to FIGS. 1 and 2, a display device according to one embodiment of the present specification includes a display panel 100 that visually reproduces an input image. The display panel 100 may include a display area AA in which an image is displayed and a non-display area NA in which the image is not displayed. The non-display area NA may be adjacent to the display area AA, or may be disposed to at least partially surround the display area AA. In the non-display area NA, various wiring and driving circuits may be mounted and a pad part PAD to which integrated circuits, printed circuits, etc. are connected may be disposed.

A plurality of light emitting elements 10 disposed in the display area AA to form pixels PXL may be micro-sized inorganic light emitting elements. The inorganic light emitting elements may be grown on a silicon wafer and then attached to the display panel through a transfer process.

The transfer process of the light emitting element 10 may be performed for each pre-divided area. In FIG. 1, the display area AA is divided into twelve transfer areas STs, but the size or number of divisions of the transfer areas is not limited thereto. The transfer process may be performed sequentially or simultaneously on first to twelfth transfer areas STs. In the transfer area ST, blue, green, and red light emitting elements 10 may be sequentially transferred, respectively.

In the non-display area NA, a data driving circuit or a gate driving circuit may be disposed, and wirings for supplying control signals to control these driving circuits may be disposed. Here, the control signals may include various timing signals including a clock signal, an input data enable signal, and a synchronization signal, and may be received through the pad portion PAD.

The pixels PXL may be driven by a pixel driving circuit. The pixel driving circuit may receive a driving voltage, an image signal (digital signal), a synchronization signal synchronized with the image signal, etc., and output an anode voltage and a cathode voltage of the light emitting element 10 to drive a plurality of pixels. The driving voltage may be a high potential voltage (EVDD). The cathode voltage may be a low potential voltage (EVSS) commonly applied to the pixels. The anode voltage may be a voltage corresponding to the pixel data value of the image signal. The pixel driving circuit may be disposed in the non-display area NA or a lower portion of the display area AA.

Each of the pixels PXL may include a plurality of sub-pixels each having a different color (e.g., white, red, green, or blue, or cyan, magenta, or yellow, etc.). For example, the plurality of pixels may include a red sub-pixel in which the light emitting element 10 that emits light in a red wavelength is disposed, a green sub-pixel in which the light emitting element 10 that emits light in a green wavelength is disposed, and a blue sub-pixel in which the light emitting element 10 that emits light in a blue wavelength is disposed. The plurality of pixels may further include white pixels or white sub-pixels.

Referring to FIGS. 2 and 3, the plurality of pixels PXL may be sequentially arranged in a first direction (X-axis direction) and a second direction (Y-axis direction). Within the pixels of the display area AA, a plurality of sub-pixels of the same color may be arranged. For example, each of the plurality of pixels may include a first red sub-pixel in which a first-first light emitting element 11a (e.g., a first red light emitting element) that emits light in a red wavelength is disposed, a second red sub-pixel in which a first-second light emitting element 11b (e.g., a second red light emitting element) emits light in a red wavelength disposed, a first green sub-pixel in which a second-first light emitting element 12a (e.g., a first green light emitting element) emitting light in a green wavelength is disposed, a second green sub-pixel in which a second-second light emitting element 12b (e.g., a second green light emitting element) emitting light in a green wavelength is disposed, a first blue sub-pixel in which a third-first light emitting element 13a (e.g., a first blue light emitting element) emitting light in a blue wavelength disposed, and a second blue sub-pixel in which a third-second light emitting element 13b (e.g., a second blue light emitting element) emitting light in a blue wavelength is disposed. The first-first light emitting element 11a, the second-first light emitting element 12a, and the third-first light emitting element 13a may be interpreted as main light emitting elements. The first-second light emitting element 11b, the second-second light emitting element 12b, and the third-second light emitting element 13b may be interpreted as sub-light emitting elements. However, the present disclosure is not limited thereto. For example, the numbers of each of the main light emitting elements and the sub-light emitting elements may be variously changed.

One sub-pixel includes one or more light emitting elements, and if one light emitting element becomes defective, the luminance of another light emitting element may be increased to adjust the luminance of the sub-pixel. However, it is not necessarily limited to thereto, and one sub-pixel may include only one light emitting element.

Each of a plurality of first electrodes 161 may be disposed in a lower portion of the light emitting element 10 and may be selectively connected to a plurality of signal wirings TL1 to TL6 by connection portions 161a. A high potential voltage may be applied to the pixel driving circuit through the signal wirings TL1 to TL6. The signal wirings TL1 to TL6 and the first electrode 161 may be formed as an electrode pattern integrated in an electrode patterning process.

Illustratively, the first signal wiring TL1 may be connected to an anode electrode of the first red sub-pixel, and the second signal wiring TL2 may be connected to an anode electrode of the second red sub-pixel. The third signal wiring TL3 may be connected to an anode electrode of the first green sub-pixel, and the fourth signal wiring TL4 may be connected to an anode electrode of the second green sub-pixel. The fifth signal wiring TL5 may be connected to an anode electrode of the first blue sub-pixel, and the sixth signal wiring TL6 may be connected to an anode electrode of the second blue sub-pixel. If one sub-pixel includes only one light emitting element, the number of signal wirings TL may be reduced by half.

A second electrode 170 may be a cathode electrode that is arranged in each row to apply a cathode voltage to the light emitting element 10 continuously arranged in the first direction (X-axis direction). The plurality of second electrodes 170 may be arranged to be spaced apart from each other in the second direction (Y-axis direction). The plurality of second electrodes 170 may be connected to the cathode voltage through a contact electrode 163. Each of the plurality of second electrodes 170 may be electrically connected to the contact electrode 163. However, it is not necessarily limited thereto, and the second electrode 170 may include one electrode layer instead of being divided into a plurality of electrodes to function as a common electrode.

Figure 4:
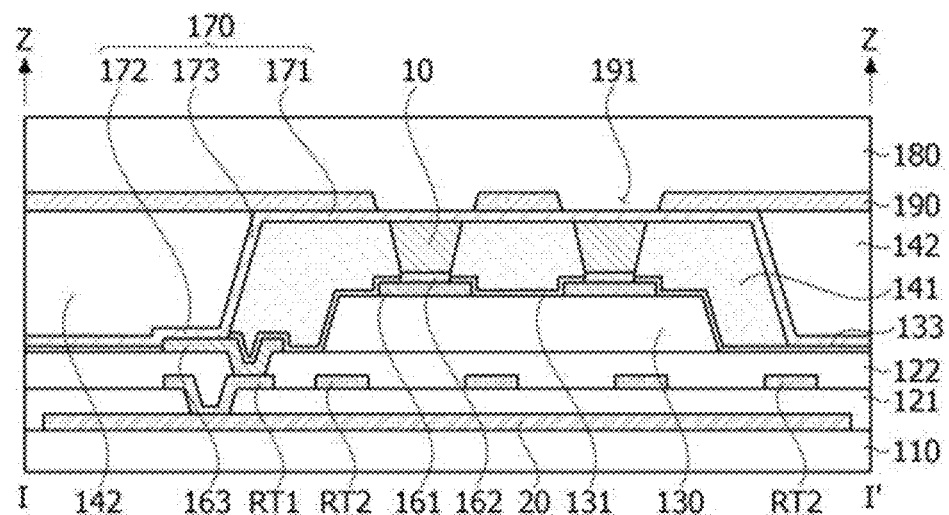
FIG. 4 is a cross-sectional view taken along line I-I' in FIG. 3 according to an embodiment of the present disclosure.
Figure 5:
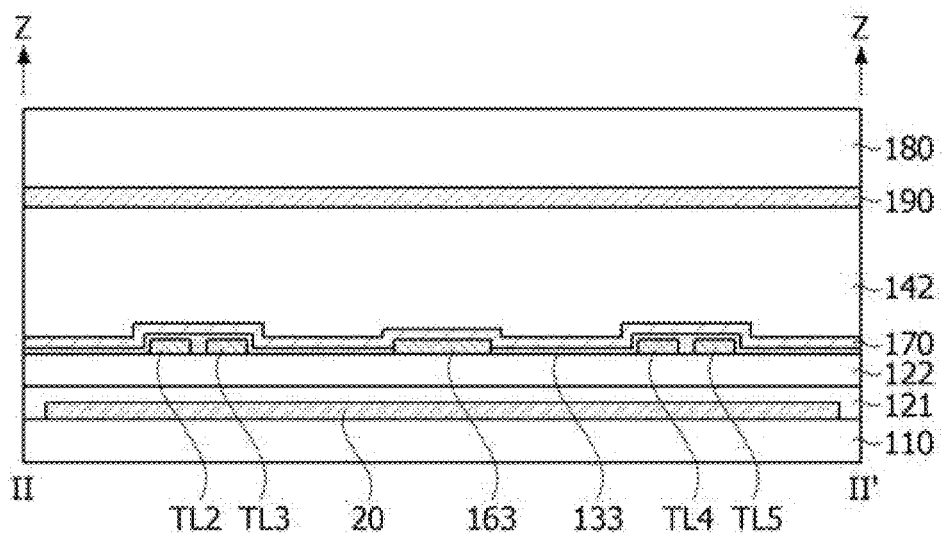
FIG. 5 is a cross-sectional view taken along line II-II' in FIG. 3 according to an embodiment of the present disclosure.
Figure 6:
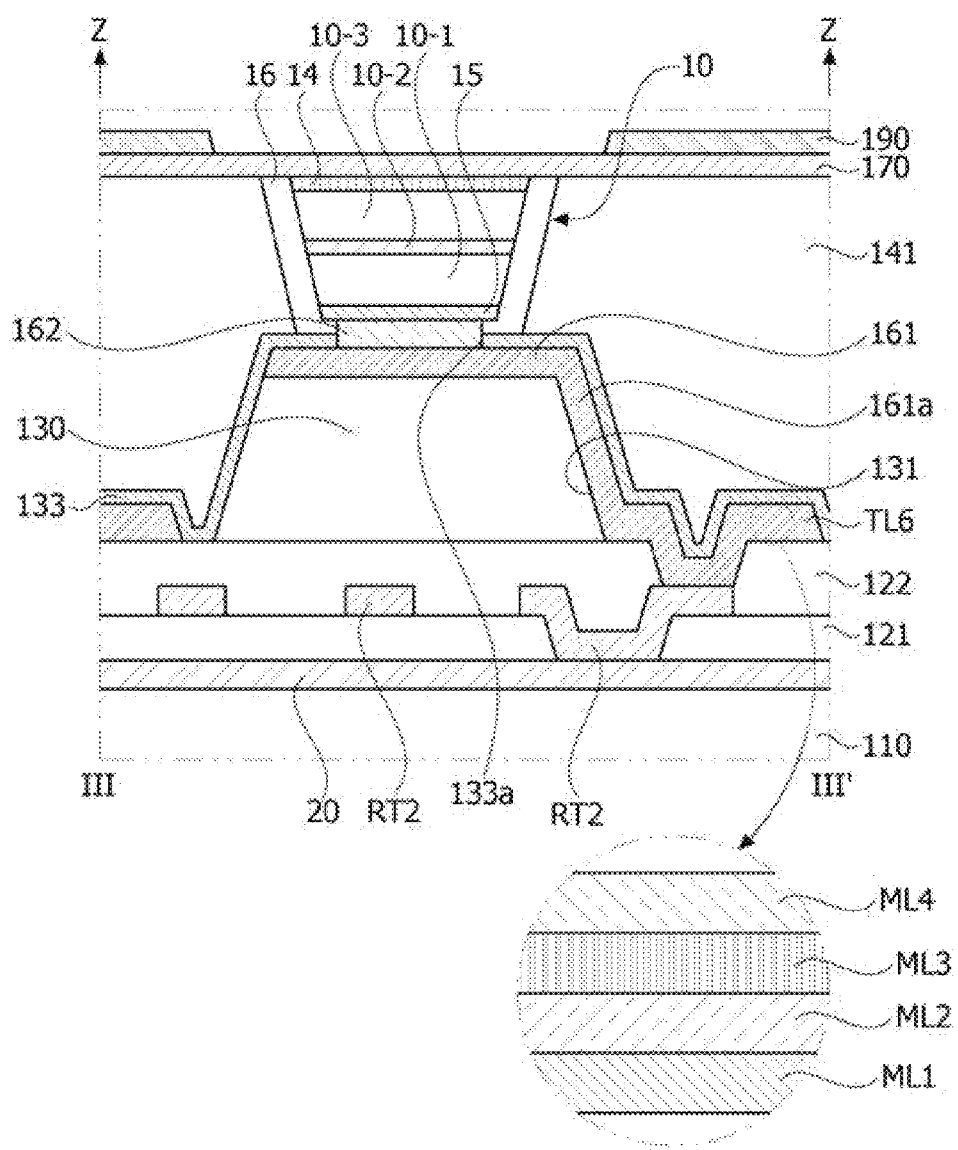
FIG. 6 is a cross-sectional view taken along line III-III' in FIG. 3 according to an embodiment of the present disclosure.
Figure 7:
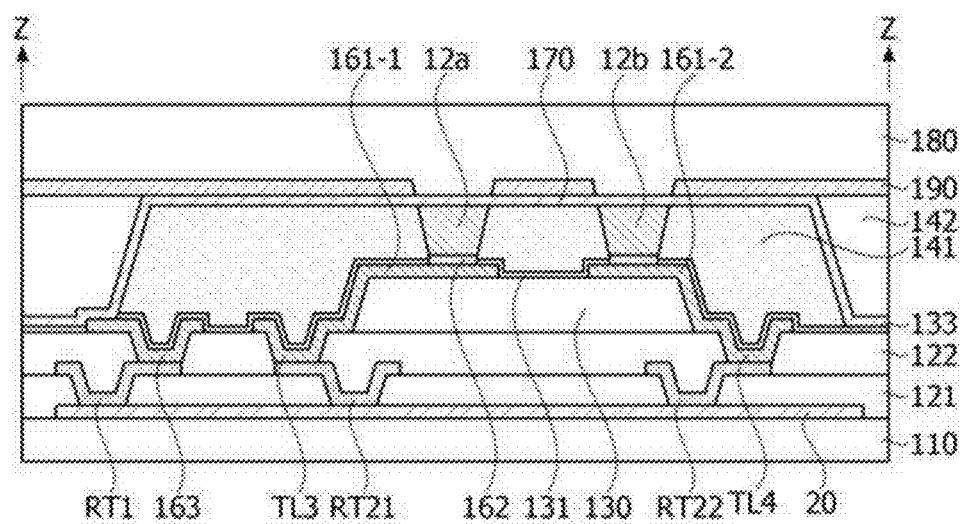
FIG. 7 is a cross-sectional view illustrating an example in which a main light-emitting element and a sub light-emitting element are electrically connected to a pixel driving circuit according to an embodiment of the present disclosure.

FIG. 4 is a cross-sectional view taken along line I-I' in FIG. 3 according to one embodiment. FIG. 5 is a cross-sectional view taken along line II-II' in FIG. 3 according to one embodiment. FIG. 6 is a cross-sectional view taken along line III-III' in FIG. 3 according to one embodiment. FIG. 7 is a cross-sectional view showing an example in which two light emitting elements are connected to a pixel driving circuit according to one embodiment.

Referring to FIGS. 3 to 5, a display device according to an embodiment includes a plurality of first electrodes 161 and a contact electrode 163 disposed on a substrate 110, a plurality of light emitting elements 10 disposed on the plurality of first electrodes 161, a first optical layer 141 disposed between the plurality of light emitting elements 10, and a second electrode 170 disposed on the plurality of light emitting elements 10.

The substrate 110 may be made of plastic with flexibility. For example, the substrate 110 may be a single-layer or multi-layer substrate made of one or more materials selected from polyimide, polyethylene terephthalate, polyethylene naphthalate, polycarbonate, polyethersulfone, polyarylate, polysulfone, and cyclic-olefin copolymer, but is not limited thereto. For example, the substrate 110 may be a ceramic substrate or a glass substrate.

A pixel driving circuit 20 may be disposed in the display area AA on the substrate 110. The pixel driving circuit 20 may include a plurality of thin film transistors using an amorphous silicon semiconductor, a polycrystalline silicon semiconductor, or an oxide semiconductor.

The pixel driving circuit 20 may include at least one driving thin film transistor, at least one switching thin film transistor, and at least one storage capacitor. When the pixel driving circuit 20 includes a plurality of thin film transistors, it may be formed on the substrate 110 by a thin film transistor (TFT) manufacturing process. In embodiments, the pixel driving circuit 20 may be a collective term for a plurality of thin film transistors electrically connected to the light emitting element 10.

The pixel driving circuit 20 may be a driver manufactured using a metal-oxide-semiconductor field effect transistor (MOSFET) manufacturing process on a single crystal semiconductor substrate 110. The driver may include a plurality of pixel driving circuits to drive a plurality of sub-pixels. When the pixel driving circuit 20 is implemented as a driver, after an adhesive layer is disposed on the substrate 110, the driver may be mounted on the adhesive layer by a transfer process.

A buffer layer 121 covering the pixel driving circuit 20 may be disposed on the substrate 110. The buffer layer 121 may be made of an organic insulating material, for example, photosensitive photo acryl or photosensitive polyimide, but is not limited thereto.

The buffer layer 121 may be formed by stacking an inorganic insulating material, for example, silicon nitride (SiNx) or silicon oxide (SiO2) in a multiple layers, and may be formed by stacking an organic insulating material and an inorganic insulating material in multiple layers.

An insulating layer 122 may be disposed on the buffer layer 121. The insulating layer 122 may be made of an organic insulating material, for example, photosensitive photo acryl or photosensitive polyimide, but is not limited thereto. Connection wirings RT1 and RT2 may be disposed on the buffer layer 121. The connection wirings RT1 and RT2 may be connected by the corresponding signal wirings TL1 to TL6 or may be connected to the signal wirings TL1 to TL6. The connection wirings RT1 and RT2 may include a plurality of wiring patterns disposed on different layers with one or more insulating layers interposed therebetween. The wiring patterns disposed on the different layers may be electrically connected via contact holes through which the insulating layers are passed.

A plurality of bank patterns 130 may be disposed on the insulating layer 122. At least one light emitting element 10 may be disposed on each bank pattern 130. For example, a first light emitting element 11 may be disposed on a first bank pattern 130, a second light emitting element 12 is disposed on a second bank pattern 130, and a third light emitting element 13 may be disposed on a third bank pattern 130.

The bank patterns 130 may be made of an organic insulating material, for example, photosensitive acryl or photosensitive polyimide, but is not limited thereto. As an example, the bank patterns 130 may include an organic insulating material such as acryl resin, epoxy resin, phenolic resin, polyamide resin, and/or polyimide resin, etc. Alternatively, the bank patterns 130 may include an inorganic insulating material such as silicon nitride, aluminum nitride, zirconium nitride, titanium nitride, hafnium nitride, tantalum nitride, silicon oxide, aluminum oxide, or titanium oxide, etc. The bank pattern 130 may guide a position to which the light emitting element 10 is to be attached in the transfer process of the light emitting element 10. The bank pattern 130 may be omitted.

A solder pattern 162 may be disposed on the first electrode 161. The solder pattern 162 may be made of indium (In), tin (Sn), or an alloy thereof, but is not limited thereto.

The plurality of light emitting elements 10 may each be mounted on the solder pattern 162. One pixel may include light emitting elements 10 of three colors. The first light emitting element 11 may be a red light emitting element, the second light emitting element 12 may be a green light emitting element, and the third light emitting element 13 may be a blue light emitting element. Two light emitting elements may be mounted in each sub-pixel.

A first optical layer 141 may cover the plurality of light emitting elements 10 and the bank pattern 130. Accordingly, the first optical layer 141 may cover between the plurality of light emitting elements 10 and between the plurality of bank patterns 130. The first optical layer 141 may extend in the first direction (X) and be spaced apart in the second direction (Y) to be separated between rows of pixels.

The first optical layer 141 may include an organic insulating material in which fine metal particles such as titanium dioxide particles are dispersed. Light emitted from the plurality of light emitting elements 10 may be scattered by fine metal particles dispersed in the first optical layer 141 to be emitted externally. In this case, the first optical layer 141 may be referred to as a light diffusion layer or a light scattering layer, and the present disclosure is not limited thereto.

The second electrode 170 may be disposed on the plurality of light emitting elements 10. The second electrode 170 may be commonly connected to the plurality of pixels PXL. The second electrode 170 may be a thin electrode through which light is transmitted. The second electrode 170 may be a transparent electrode material, for example, indium tin oxide (ITO), but is not necessarily limited thereto. For example, the second electrode 170 may include a thin metal material such as Au, W, Pt, Si, Ir, Ag, Cu, Ni, Ti, or Cr, and an alloy thereof. Alternatively, the second electrode 170 may include a transparent conductive material such as indium-tin-oxide (ITO) or indium-zinc-oxide (IZO).

The second electrode 170 may extend in the first direction (X-axis direction) and be spaced apart in the second direction (Y-axis direction). The second electrode 170 may include a first area 171 disposed on a top surface (e.g., an uppermost surface) of the light emitting element 10 and a top surface (e.g., an uppermost surface) of the first optical layer 141, a second area 172 in contact with the contact electrode 163 and electrically connected to the contact electrode 163, and a third area 173 disposed on a side of the first optical layer 141 (e.g., an inclined surface) and connecting the first area 171 and the second area 172.

On a plane, each of the plurality of second electrodes 170 may overlap the first optical layer 141, and the second area 172 may cover a plane outside the first optical layer 141.

The second optical layer 142 may be an organic insulating material surrounding the first optical layer 141. The second optical layer 142 may be disposed on the insulating layer 122 together with the first optical layer 141. The first optical layer 141 and the second optical layer 142 may include the same material (e.g., siloxane). For example, the first optical layer 141 may be siloxane containing titanium oxide (TiOx), and the second optical layer 142 may be siloxane not containing titanium oxide (TiOx). However, it is not necessarily limited to thereto, and the first optical layer 141 and the second optical layer 142 may be formed of the same material or may be formed of different materials.

According to an embodiment, since the second area 172 of the second electrode 170 is connected to the contact electrode 163 in an overall flat state, excessive stress is not concentrated at the point of connection with the contact electrode 163. Therefore, it is possible to effectively prevent or reduce cracks from occurring in the second electrode 170.

The second optical layer 142 may cover the second area 172 and the third area 173 of the second electrode 170. The top surface of the second optical layer 142 and the top surface of the first area 171 of the second electrode 170 may be coplanar. In other words, the first optical layer 141 and the second optical layer 142 may function as planarization layers. As a result, a pattern of a black matrix 190 may be easily formed on the first optical layer 141 and the second optical layer 142 because there is no step on the surface where the black matrix 190 is formed. However, it is not necessarily limited to thereto, and the top surfaces of the second optical layer 142 and the second electrode 170 may have different heights.

The black matrix 190 may be an organic insulating material to which black pigment is added. Beneath the black matrix 190, the second electrode 170 may be in contact with the contact electrode 163. A transmission hole 191 may be formed between the patterns of the black matrix 190, through which light emitted from the light emitting element 10 is externally emitted. By the black matrix 190, the issue of mixing of light emitted from neighboring light emitting elements 10 by the first optical layer 141 may be alleviated or obviated.

The cover layer 180 may be an organic insulating material for covering the black matrix 190 and the second electrode 170. In FIG. 3, the configuration of the black matrix 190 and the cover layer 180 is omitted.

The contact electrode 163 is electrically connected to the first connection wiring RT1 disposed on a lower portion thereof, and the first connection wiring RT1 may be connected to the pixel driving circuit 20. Accordingly, the second electrode 170 may be applied with a cathode voltage through the contact electrode 163. The first electrode 161 may be electrically connected to the second connection wiring RT2 as will be further described below.

Referring to FIG. 5, the contact electrode 163 and signal wirings TL1 to TL6 may be disposed on the same plane. The pixel driving circuit 20 may be disposed on a lower portion of the contact electrode 163 and the signal wirings TL1 to TL6. When the pixel driving circuit 20 is a driver, a plurality of drivers may be disposed in the display panel.

A passivation layer 133 may expose the contact electrode 163 so that the contact electrode 163 and the second electrode 170 are electrically connected. In addition, the passivation layer 133 may insulate the signal wirings TL2 to TL5 and the second electrode 170. For example, the passivation layer 133, which is a kind of dielectric (e.g., an inorganic dielectric), may be constituted by a single layer made of a silicon oxide (SiOx) film, a silicon nitride (SiNx) film, or a silicon oxynitride (SiOxNy) film or a multilayer film thereof, etc.

Referring to FIG. 6, a connection portion 161a of the first electrode 161 extends to one side surface 131 of the bank pattern 130 and is electrically connected to the connection wiring RT2 disposed on the buffer layer 121.

The first electrode 161, the connection portion 161a, the signal wiring TL, and/or the connection wirings RT1 and RT2 may include a single or multi-layer metal layer selected from titanium (Ti), molybdenum (Mo), and aluminum (Al). The first electrode 161, the connection portion 161a, the signal wiring TL and/or the connection wirings RT1 and RT2 may be formed in a multi-layer structure including a first layer ML1, a second layer ML2, a third layer ML3, and a fourth layer ML4.

The first layer ML1 and the third layer ML3 may include titanium (Ti) or molybdenum (Mo). The second layer ML2 may include aluminum (Al). The fourth layer ML4 may include a transparent conductive oxide layer such as indium tin oxide (ITO) or indium zinc oxide (IZO), which has good adhesion to the solder pattern 162, corrosion resistance, and acid resistance.

The first layer ML1, the second layer ML2, the third layer ML3, and the fourth layer ML4 may be sequentially deposited and then patterned by performing a photolithography process and an etching process.

The passivation layer 133 may be disposed on the first electrode 161 and the signal wiring TL and may include an opening hole 133a exposing the solder pattern 162.

The light emitting element 10 may include a first conductive type semiconductor layer 10-1, an active layer 10-2 disposed on the first conductive type semiconductor layer 10-1, and a second conductive type semiconductor layer 10-3 disposed on the active layer 10-2. A first driving electrode 15 may be disposed on a lower portion of the first conductive type semiconductor layer 10-1, and a second driving electrode 14 may be disposed on an upper portion of the second conductive type semiconductor layer 10-3.

The light emitting element 10 may be formed on a silicon wafer using methods such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), sputtering, and the like.

The first conductivity type semiconductor layer 10-1 may be implemented as a compound semiconductor such as Group III-V, Group II-VI, etc., and may be doped with a first dopant. The first conductive type semiconductor layer 10-1 may be formed of any one or more of the semiconductor materials having a composition formula of $Al_{x1}In_{y1}Ga_{(1-x1-y1)}N$ ($0 \leq x1 \leq 1$, $0 \leq y1 \leq 1$, $0 \leq x1+y1 \leq 1$), InAlGaN, AlGaAs, GaP, GaAs, and AlGaInP, but is not limited thereto. When the first dopant is an n-type dopant such as Si, Ge, Sn, Se, Te, etc., the first conductive type semiconductor layer 10-1 may be an n-type nitride semiconductor layer. However, when the first dopant is a p-type dopant such as Mg, Zn, Ca, Sr, Ba, etc., the first conductive type semiconductor layer 10-1 may be a p-type nitride semiconductor layer.

The active layer 10-2 is a layer in which electrons (or holes) injected through the first conductive type semiconductor layer 10-1 meet holes (or electrons) injected through the second conductive type semiconductor layer 10-3. The active layer 10-2 may generate light that transitions to lower energy levels as the electrons and holes are recombined, and has a corresponding wavelength.

The active layer 10-2 may have any one of a single well structure, a multi-well structure, a single quantum well structure, a multi quantum well (MQW) structure, a quantum dot structure, or a quantum line structure, and the structure of the active layer 10-2 is not limited thereto. The active layer 10-2 may generate light in a visible light wavelength band. Illustratively, the active layer 10-2 may output light in any one of blue, green, and red wavelength bands.

The second conductive type semiconductor layer 10-3 may be disposed on the active layer 10-2. The second conductive type semiconductor layer 10-3 may be implemented as a compound semiconductor such as Group III-V, Group II-VI, etc., and the second conductive type semiconductor layer 10-3 may be doped with a second dopant. The second conductive type semiconductor layer 10-3 may be formed from semiconductor materials having a composition formula of $In_{x2}Al_{y2}Ga_{1-x2+y2}N$ ($0 \leq x2 \leq 1$, $0 \leq y2 \leq 1$, $0 \leq x2+y2 \leq 1$) or materials selected from AlInN, AlGaAs, GaP, GaAs, GaAsP, and AlGaInP. When the second dopant is a p-type dopant such as Mg, Zn, Ca, Sr, Ba, etc., the second conductive type semiconductor layer 10-3 doped with the second dopant may be a p-type semiconductor layer. When the second dopant is an n-type dopant, the second conductive type semiconductor layer 10-3 may be an n-type nitride semiconductor layer.

A reflective layer 16 may be disposed on a side surface and lower portion of the light emitting element 10. The reflective layer 16 may have a structure in which a reflective material is dispersed in a resin layer, but is not necessarily limited to thereto. Illustratively, the reflective layer 16 may be manufactured as a reflector of various structures. Light emitted from the active layer 10-2 by the reflective layer 16 may be reflected upward to increase light extraction efficiency.

Although the embodiment is described as a vertical structure in which the driving electrodes 14 and 15 are disposed on the upper and lower portion of the light-emitting structure, the light-emitting device may have a lateral structure or a flip chip structure in addition to the vertical structure.

Referring to FIG. 7, a main light emitting element 12a and sub-light emitting element 12b of the sub-pixel may be disposed on the bank pattern 130. The second light emitting element 12 will be illustratively described, and the first light emitting element 11 and the third light emitting element 13 may be similarly configured. A first-first electrode 161-1 connected to the main light emitting element 12a may extend to one side surface of the bank pattern 130 to be electrically connected to the second-first connection wiring RT21 disposed on a lower portion thereof. The first-second electrode 161-2 connected to the sub-light emitting element 12b may extend to the other side surface of the bank pattern 130 to be electrically connected to the second-second connection wiring RT22 disposed on a lower portion thereof.

The pixel driving circuit 20 may apply an anode voltage to the main light emitting element 12a by the second-first connection wiring RT21, and may apply an anode voltage to the sub-light emitting element 12b by the second-second connection wiring RT22. The pixel driving circuit 20 may apply a cathode voltage to the main light emitting element 12a and the sub-light emitting element 12b through the first connection wiring RT1 and the second electrode 170.

The pixel driving circuit 20 may adjust luminance by driving the main light emitting element 12a without driving the sub-light emitting element 12b, or may adjust luminance by simultaneously driving the main light emitting element 12a and the sub-light emitting element 12b. If the main light emitting element 12a is darkened, the luminance may be adjusted by driving only the sub-light emitting element 12b.

Figure 8:
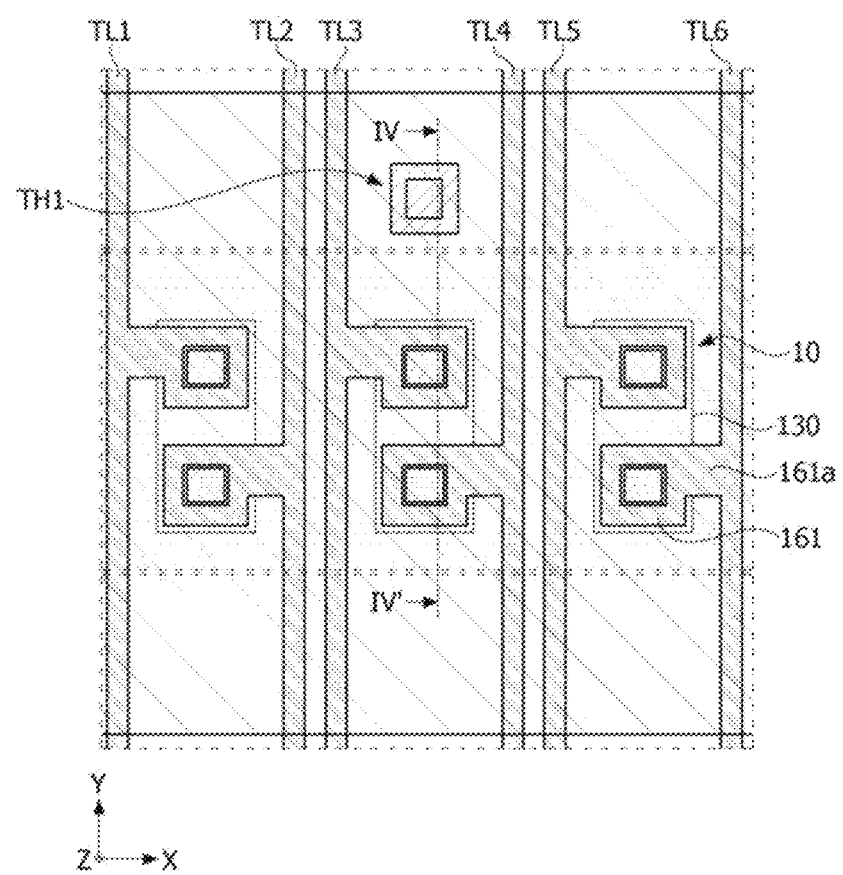
FIG. 8 is a diagram illustrating a display device according to another embodiment of the present disclosure.
Figure 9:
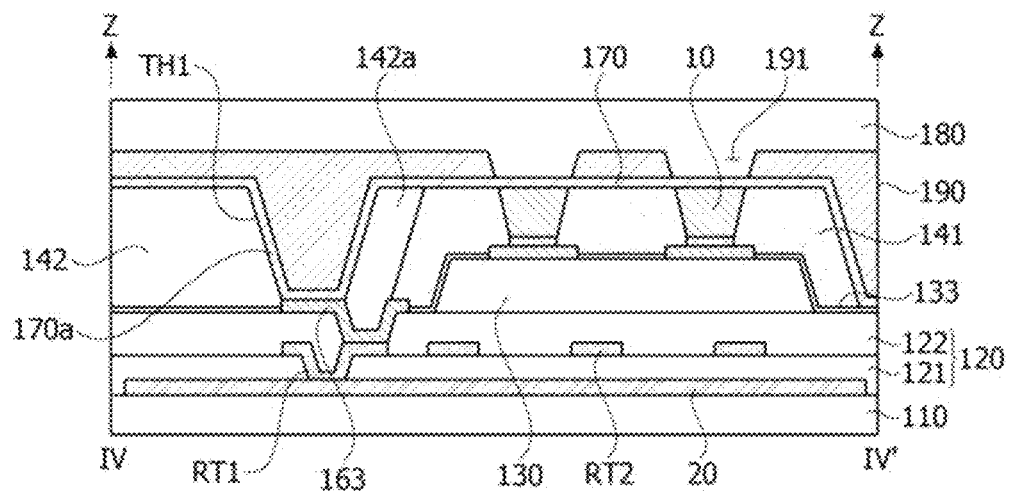
FIG. 9 is a cross-sectional view taken along line IV-IV' in FIG. 8 according to an embodiment of the present disclosure.

FIG. 8 is a diagram illustrating a display device according to another embodiment of the present disclosure. FIG. 9 is a cross-sectional view taken along line IV-IV' in FIG. 8 according to one embodiment of the present disclosure.

Referring to FIGS. 8 and 9, the second electrode 170 may be electrically connected to the contact electrode 163 through a contact hole TH1 formed in the second optical layer 142. The second optical layer 142 may include a contact hole TH1 exposing the contact electrode 163. The second electrode 170 may be inserted into the contact hole TH1 of the second optical layer 142 to be in contact with an upper surface of the contact electrode 163. The contact hole TH1 may be formed in an outer area of the pixel. A portion 142a of the second optical layer 142 may be disposed between the contact hole TH1 and the first optical layer 141.

In the manufacturing process of the display panel, thin film layers of a plurality of display panels may be simultaneously formed on a mother substrate, and then the display areas may be separated in units of single display panels in the scribing process.

Figure 10:
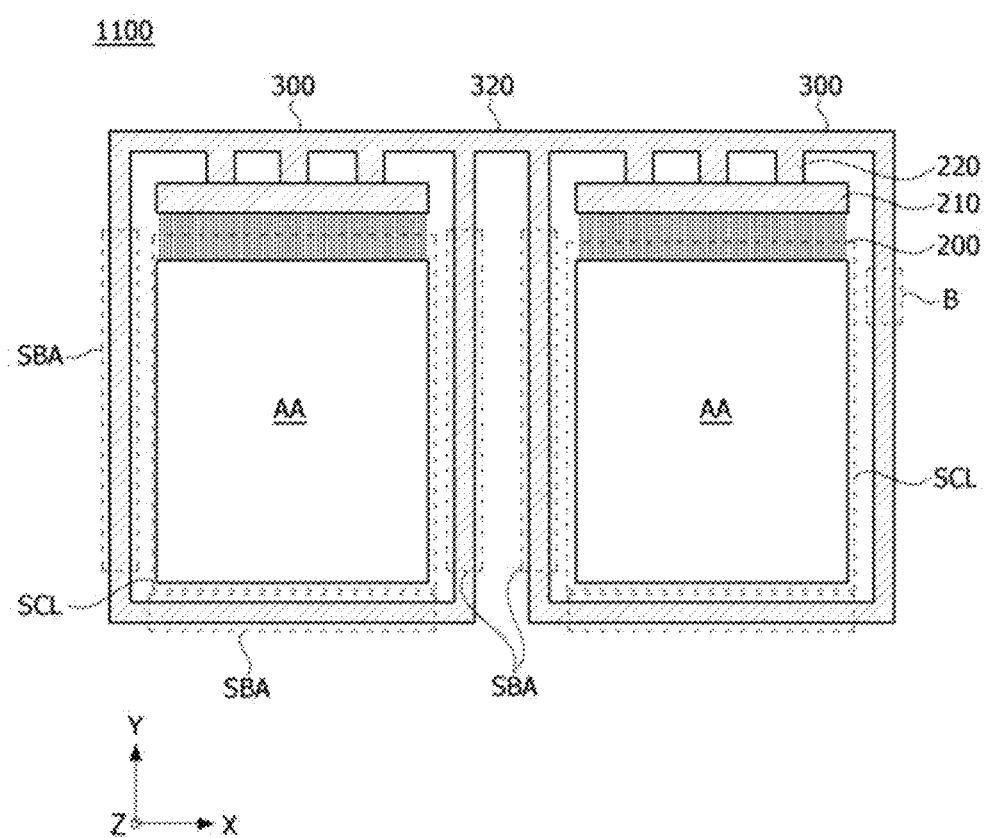
FIG. 10 is a diagram illustrating two display panels disposed on a mother substrate according to an embodiment of the present disclosure.
Figure 11:
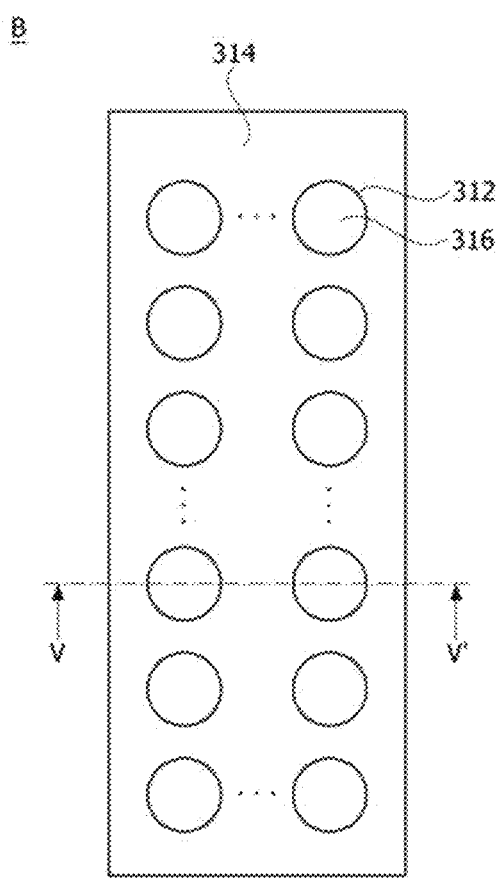
FIG. 11 is an enlarged view of part B illustrated in FIG. 10 according to one embodiment of the present disclosure.

FIG. 10 is a diagram illustrating two display panels disposed on a mother substrate according to one embodiment. FIG. 11 is an enlarged view of a part B shown in FIG. 10 according to one embodiment of the present disclosure.

Referring to FIGS. 10 and 11, the mother substrate 1100 includes a plurality of display panels. After the pixel driving circuit 20, the thin film layers, and the light-emitting elements are disposed on the mother substrate and the inspection process is completed, each of the display panels is separated from the mother substrate along the scribing line SCL in the scribing process.

In a process of manufacturing a display panel, a large amount of charge may be generated in a thin film deposition process, for example, a process of depositing a metal layer to be patterned into the solder pattern 162. This amount of charge may generate electrostatic discharge ESD, thereby damaging thin films of the display panel.

The conductive ring 300 is disposed in the non-display area of the mother substrate 1100 so that ESD generated in the process of manufacturing the display panel does not affect the display panel. The conductive ring 300 is electrically connected to the display panels to become an equipotential to the display panels. That is, the display panels have a same electrical potential. The conductive ring 300 includes an electrostatic blocking area SBA. The conductive ring 300 includes a ring-shaped wiring pattern surrounding a circumference of each of the display panels in a plan view. Adjacent conductive rings 300 may be connected to each other through the connection portion 320. For example, a first conductive ring surrounds a first display area AA from the plurality of display areas AA and a second conductive ring that surrounds a second display area AA from the plurality of display areas AA as shown in FIG. 10. The first conductive ring is connected to the second conductive ring via the connection portion 320. The scribing line SCL may be set between the display area of the display panel and the conductive ring 300.

The display panel includes a plurality of pads 200 disposed and exposed outside the display area AA in which pixels are disposed. The pads 200 are electrically connected to wiring patterns of the display area AA. The external host system may transmit signals, driving voltages, and the like required for driving the pixels to the pixel driving circuit through the pads 200. A flexible printed circuit film, for example, a flexible printed circuit (FPC) may be bonded to the pads 200 through an anisotropic conductive film (ACF). The main board of the host system may be connected to one end of the flexible circuit film, and the pads 200 of the display panel may be connected to the other end thereof.

The mother substrate 1100 includes a non-display area that is to be disposed outside the scribing line SCL to be removed. The pads 200 may be connected to a shorting bar 210 disposed in the non-display area of the mother substrate 1100. The shorting bar 210 is connected to the conductive ring 300 through a connection portion 220. The conductive ring 300, the connection portion 220, the shorting bar 210, and the pads 200 may be formed in a metal pattern. Also, as metal wiring in which wiring patterns disposed on different layers with an insulating layer interposed therebetween are connected through a contact hole, the conductive ring 300, the connection portion 220, the shorting bar 210, and the pads 200 may be formed on the mother substrate 1100.

Signal wirings of the conductive ring 300 and the display area AA may be equi-potential by the connection structure of the conductive ring 300, the connection portions 220 and 320, the shorting bar 210, and the pads 200.

One or more electrostatic blocking areas SBA may be disposed in the conductive ring 300. For example, as shown in FIG. 10, the electrostatic blocking area SBA may be disposed at three portions including left and right sides and a lower end of the conductive ring 300 except for a portion where the pads 200 are disposed, but is not limited thereto. The electrostatic blocking area SBA may also be disposed at the corner portion of the conductive ring 300.

The electrostatic blocking area SBA may include a capacitor that bursts when an ESD occurs. Since a large amount of charge is dissipated when the capacitor of the electrostatic blocking area SBA is burst, the amount of charge flowing to the display area AA when the ESD occurs may be minimized or reduced.

Figure 12:
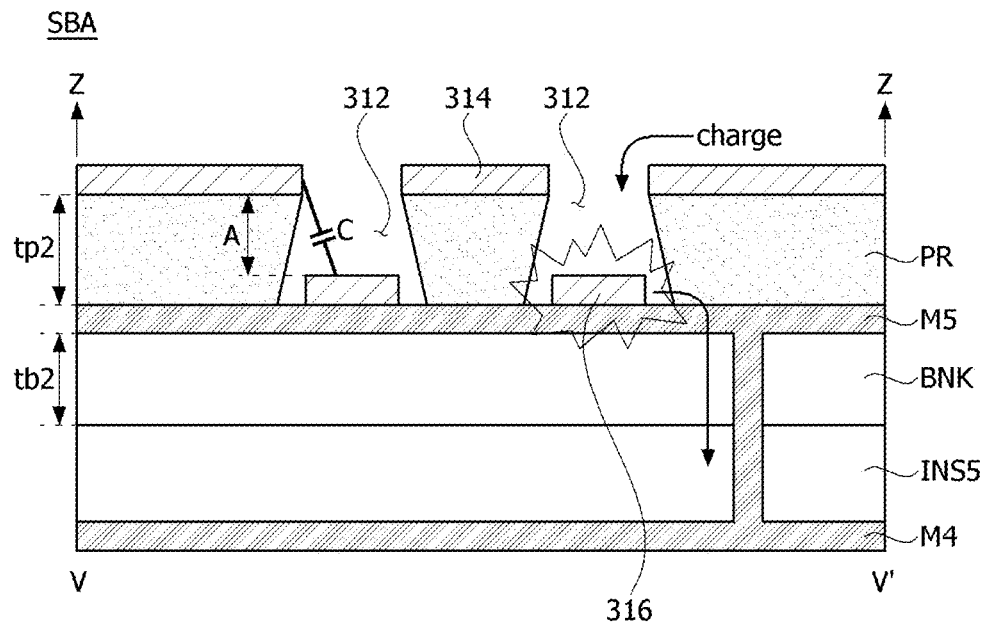
FIG. 12 is a cross-sectional view showing a cross-sectional structure of an electrostatic blocking area by cutting along line V-V' in FIG. 11 according to an embodiment of the present disclosure.
Figure 17:
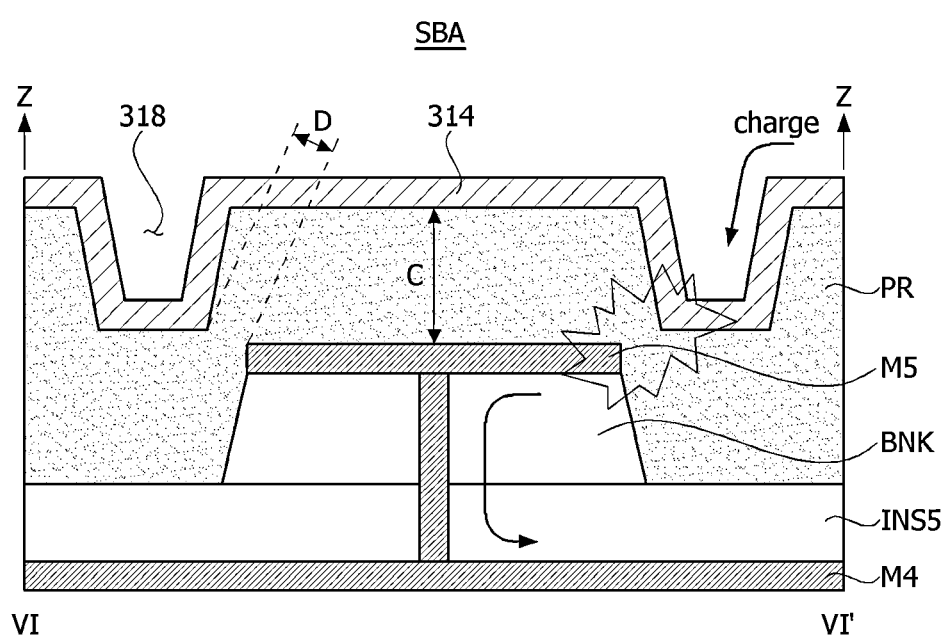
FIG. 17 is a cross-sectional view showing a cross-sectional structure of an electrostatic blocking area by cutting along line VI-VI' in FIG. 16 according to an embodiment of the present disclosure.

A plurality of wiring patterns may be disposed in the electrostatic blocking area SBA, and at least two wiring patterns may overlap each other, but the present disclosure is not limited thereto. The electrostatic blocking area SBA may include a plurality of openings 312, as shown in FIGS. 11 and 12. The second metal layer 316 is exposed in each of the openings 312 of the electrostatic blocking area SBA. That is, a second metal layer 316 may be disposed in each of the openings 312 of the electrostatic blocking area SBA. In the openings 312, the first and second metal layers 314 and 316 may be separated (e.g., disconnected from each other) to have a step difference from each other with a photoresist pattern (PR) interposed therebetween. The first and second metal layers 314 and 316 stepped in the opening 312 may be separated from or connected to each other according to a side shape of the photoresist pattern as shown in FIGS. 12 and 17. In each opening 312, a capacitor may be formed by the first and second metal layers 314 and 316 separated from each other with an insulating layer (for example, a photoresist PR) interposed therebetween. It is to be noted that although the openings 312 are shown as a circular shape in FIG. 11, the present disclosure is not limited thereto. For example, the openings 312 may have a rectangular shape, an ellipse or oval shape, or a quadrilateral shape, etc. In addition, although the openings 312 are shown as being separated from each other in FIG. 11, the present disclosure is not limited thereto and the openings 312 may be connected with each other to form one or more slits extending along the electrostatic blocking area SBA.

A lift-off process may be used as a method of patterning the metal layers 314 and 316 on the mother substrate 1100. A photoresist is applied on the mother substrate 1100, and the photoresist pattern remains on the mother substrate through an exposure process and a development process. When the metal layers 314 and 316 are deposited on the mother substrate on which the photoresist pattern is disposed, the metal layer is separated by the photoresist pattern, and a step difference exists between the metal layers 314 and 316 by the height of the photoresist pattern. Subsequently, when the photoresist pattern is completely removed, the metal layer disposed thereon is removed together with the photoresist pattern, and a metal pattern having a desired shape remains on the mother substrate 1100.

Figure 13:
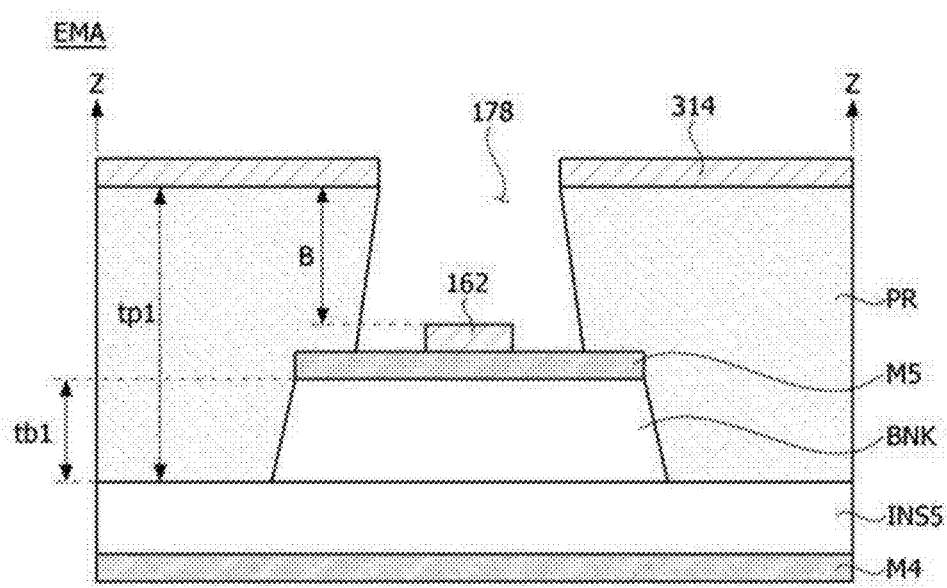
FIG. 13 is a cross-sectional view showing a cross-sectional structure in which a photoresist and a metal layer are covered in a display area of a display panel according to an embodiment of the present disclosure.

FIG. 12 is a cross-sectional view showing a cross-sectional structure of an electrostatic blocking area by cutting along a line V-V' in FIG. 11 according to one embodiment. FIG. 13 is a cross-sectional view showing a cross-sectional structure of a display area of a display panel covered with a photoresist and a metal layer according to one embodiment.

Referring to FIGS. 12 and 13, a photoresist PR is applied to the entire surface of the mother substrate 1100 to form the solder pattern 162 in the light-emitting area EMA of sub-pixels on the mother substrate 1100. The photoresist covers display areas AA and a non-display area outside the display areas AA on the mother substrate 1100. The photoresist is patterned through exposure and development processes. The photoresist pattern PR includes openings 178 in which the solder pattern 162 of the display area AA is positioned on the mother substrate 1100, and a plurality of openings 312 positioned in the electrostatic blocking area SBA. The solder pattern 162 may be interpreted as the third metal layer.

In the display areas AA and the non-display area outside the display areas AA, the photoresist pattern PR may have an inverted tapered shape, for example, may become thicker toward the top. That is, an upper surface of the photoresist pattern PR is narrower than a lower surface of the photoresist pattern PR. In this case, the openings 178 of the display area AA and the openings 312 of the non-display area on the mother substrate 1100 become narrower toward the top.

A metal layer is deposited on the entire surface of the mother substrate 1100 on which the photoresist pattern PR is formed. The metal layer includes a first metal layer 314 covering an upper surface of the photoresist pattern PR, a second metal layer 316 disposed inside the opening 312 of the electrostatic blocking area SBA, and a solder pattern 162 disposed in the opening 178 of the display area AA. Accordingly, the first metal layer 314, the second metal layer 316, and the solder pattern 162 may be simultaneously formed in a process of manufacturing a display panel with a same material. For example, first metal layer 314, the second metal layer 316, and the solder pattern 162 may be formed of a same material, in a same process, but the present disclosure is not limited thereto.

When the photoresist pattern PR is removed in the lift-off process, the first metal layer 314 covering the photoresist pattern PR may also be removed.

On the mother substrate 1100, the first and second metal layers 314 and 316 disposed in the electrostatic blocking area SBA are spaced apart from each other with air interposed therebetween, and an air gap A exists. As a result, a capacitor C is formed in each of the openings 312 of the electrostatic blocking area SBA. As shown in FIG. 13, the gap A between the first and second metal layers 314 and 316 is smaller than the gap B between the first metal layer 314 covering the photoresist pattern PR of the display area AA and the solder pattern 162 in the opening 178. Accordingly, since the gap between the capacitor electrodes of the electrostatic blocking area SBA is smaller than the gap between the metal layers 314 and 162 of the display area AA, when ESD is generated in the deposition process of the first and second metal layers 314 and 316 and charges move along the conductive ring 300, the capacitor C of the electrostatic blocking area SBA may burst before the charges move to the display area AA. In this case, most of the amount of charge generated due to the ESD disappears, and some remaining charges may be discharged through the wiring patterns M4 and M5. The wiring patterns M4 and M5 may be electrically connected to a base voltage source GND or a power wiring.

A capacitor also exists between the first metal layer 314 and the solder pattern 162 in the light-emitting areas EMA of the mother substrate, but the gap B between the metal layers 314 and 162 of the capacitor is larger than the gap A of the metal layers 314 and 316 of the capacitor C formed in the electrostatic blocking area SBA, so that the capacitor C of the electrostatic blocking area SBA bursts first when ESD occurs. As a result, when ESD occurs, charges flowing along the conductive ring 300 do not flow into the display area AA and thus do not affect the pixels in the display area.

In order to reduce the distance A between the first and second metal layers 314 and 316 in the electrostatic blocking area SBA to be less than the distance B between the metal layers 162 and 314 disposed in the light-emitting area EMA, the thickness tp2 (e.g., a second thickness) of the photoresist pattern PR in the electrostatic blocking area SBA is less than the thickness tp1 (e.g., a first thickness) in the display area.

Thus, the second metal layer 316 is closer to a first portion of the first metal layer 314 in the electrostatic blocking area SBA than the third metal layer 162 is to the second portion of the first metal layer 314 in the light-emitting area EMA. In another embodiment for realizing this, the thickness tb2 of the insulating layer used as the bank pattern BNK in the electrostatic blocking area SBA may be greater than the thickness tb1 in the display area.

By varying the density of the metal layer under the photoresist pattern PR, for example, the densities of the stacked wiring patterns M1 to M5 between areas, the thicknesses tp1 and tp2 of the photoresist pattern PR may be different when the photoresist is applied. In the photoresist exposure process, the exposure amount of the photoresist may be different between the electrostatic blocking area and the display area of the display panel by using the photomask as a half-tone mask, so that the thicknesses tp1 and tp2 of the photoresist pattern PR may be different. The density of the metal layer under the photoresist pattern PR may refers to or relate to the number of the metal layers disposed under the photoresist pattern PR, and the present disclosure is not limited thereto. That is, a number of metal wiring patterns overlapping the wiring pattern M5 in the light-emitting area EMA and the opening 178 (e.g., three wiring patterns) is less than a number of metal wiring patterns overlapping the wiring pattern M5 and the opening 312 in the electrostatic blocking area SBA (e.g., four wiring patterns).

Figure 14:
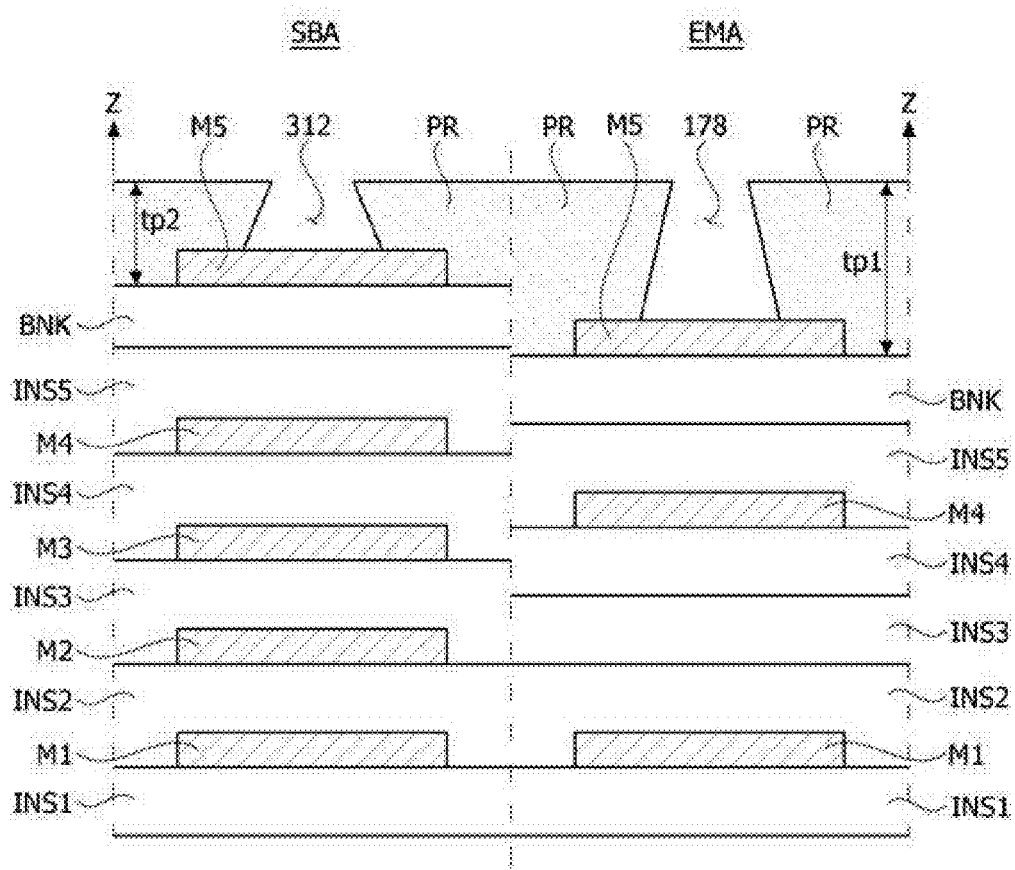
FIG. 14 is a cross-sectional view illustrating an example in which metal layer densities are different between an electrostatic blocking area and a light-emitting area on a mother substrate according to an embodiment of the present disclosure.

FIG. 14 is a cross-sectional view illustrating an example in which metal layers have different densities between the electrostatic blocking area and the light-emitting area on a mother substrate.

Referring to FIG. 14, a plurality of insulating layers INS1 to INS5 and a plurality of wiring patterns M1 to M5 separated from each other with the insulating layers INS1 to INS5 interposed therebetween may be included on the mother substrate 1100.

N wiring patterns M1 to M5 (where N is a natural number equal to or greater than 2) may be disposed under the opening 312 of the electrostatic blocking area SBA. When viewed from a longitudinal section of the mother substrate 1100, a plurality of wiring patterns M1 to M5 overlap each other in the electrostatic blocking area 31 with an insulating layer interposed therebetween. In contrast, M wiring patterns M1, M4, and M5 (where M is a natural number less than N) are disposed under the opening 178 of the light-emitting area EMA. Due to the different number of wiring patterns in the light-emitting area EMA and the electrostatic blocking area SBA, an upper surface of the bank BNK on which the wiring pattern M5 in the light-emitting area EMA is disposed and an upper surface of the bank BNK on which the wiring pattern M5 is disposed are misaligned as shown in FIG. 14.

When a photoresist is applied on the mother substrate 1100, the photoresist flows down from the electrostatic blocking area SBA having a high density of the metal layers, and thus the thickness of the photoresist becomes thinner. In this case, in the light-emitting area EMA having a low density of the metal layers, a surface on which the photoresist is applied is relatively low, and thus the photoresist becomes thick on the light-emitting area EMA. As a result, since the thickness tp2 of the photoresist of the electrostatic blocking area SBA becomes smaller than the thickness tp1 of the photoresist formed in the light-emitting area EMA, the distance A between the metal layers 314 and 316 forming the capacitor C in the electrostatic blocking area SBA becomes smaller than the distance B between the metal layers 162 and 314 in the light-emitting area EMA.

Figure 15:
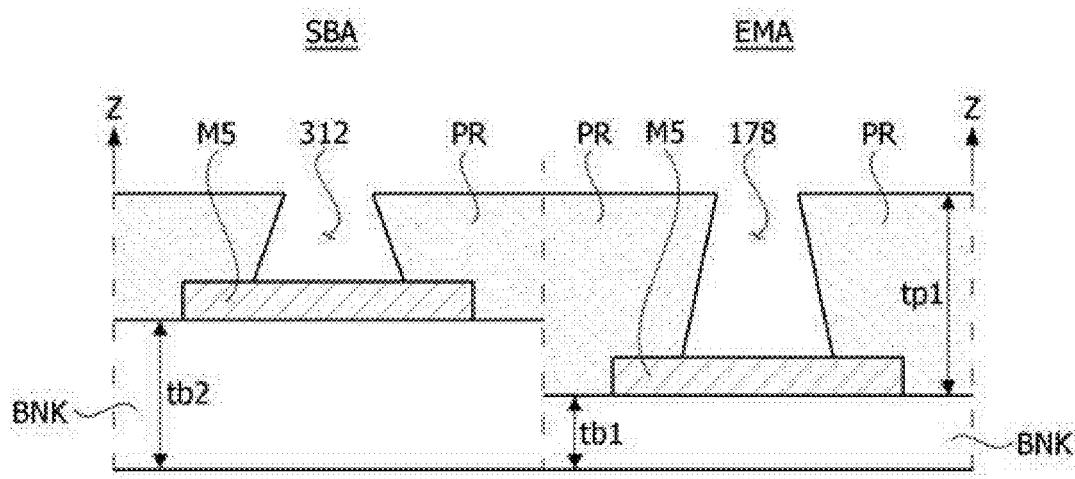
FIG. 15 is a cross-sectional view illustrating an example in which a thickness of an insulating layer is different between an electrostatic blocking area and a light-emitting area on a mother substrate according to an embodiment of the present disclosure.

FIG. 15 is a cross-sectional view illustrating an example in which a thickness of an insulating layer is different between an electrostatic blocking area and an emitting area on a mother substrate according to one embodiment.

Referring to FIG. 15, the bank pattern BNK disposed under the opening 312 of the electrostatic blocking area SBA may be formed to be thicker than the bank pattern BNK disposed under the opening 178 of the light-emitting area EMA. In other words, the bank pattern thickness tb2 of the electrostatic blocking area SBA may be greater than the thickness tb1 of the bank pattern BNK of the light-emitting area EMA. As a result, the gap A between the metal layers 314 and 316 forming the capacitor C in the electrostatic blocking area SBA may be smaller than the gap B between the metal layers 162 and 314 of the light-emitting area EMA due to the difference in thickness of the bank pattern BNK.

The bank pattern BNK may be formed of a photosensitive resin, for example, photosensitive photoacryl or photosensitive polyimide. In the exposure process of the photosensitive resin for a bank pattern, the exposure amounts of the photosensitive resin are different between the electrostatic blocking area SBA and the display area AA by using the photo mask as a half-tone mask, and then, as shown in FIG. 15, the thicknesses tp1 and tp2 of the bank pattern BNK may be different for each area.

Figure 16:
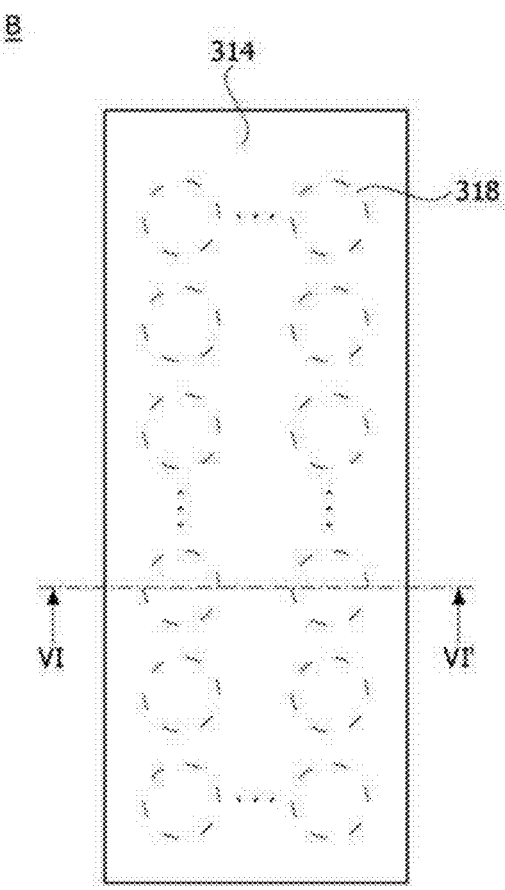
FIG. 16 is an enlarged view of part B shown in FIG. 10 according to another embodiment of the present disclosure.

FIG. 16 is an enlarged view of part B shown in FIG. 10 in another embodiment of the present disclosure. FIG. 17 is a cross-sectional view showing a cross-sectional structure of an electrostatic blocking area by cutting along line VI-VI' in FIG. 16 according to one embodiment.

Referring to FIGS. 16 and 17, in the electrostatic blocking area SBA, a metal layer, for example, a wiring pattern M5, is disposed on the bank pattern BNK. The photoresist pattern PR covers the bank pattern BNK and the insulating layer INS5 on which the wiring pattern M5 is disposed.

In the electrostatic blocking area SBA, the photoresist pattern PR includes a plurality of grooves 318. The bank pattern BNK is disposed between the adjacent grooves 318. Accordingly, the metal layer, for example, the wiring pattern M5, is not exposed in the grooves 318 of the photoresist pattern PR.

In each of the grooves 318 of the electrostatic blocking area SBA, the metal layer 314 and the wiring pattern M5 are separated with the photoresist pattern PR interposed therebetween, and a capacitor is formed. The minimum distance D between the metal layer 314 and the wiring pattern M5 in the groove 318 is smaller than the distance C between the metal layer 314 and the wiring pattern M5 spaced apart from each other with the thick photoresist pattern PR interposed therebetween in the portion without the groove 318. That is, a distance between a portion of the metal layer 314 within a concave groove 318 from the plurality of concave grooves and the wiring pattern M5 in the electrostatic blocking area SBA is smaller than a distance between the metal layer 314 and the solder pattern 162 in the light-emitting area EMA. The distance C between the metal layer 314 and the wiring pattern M5 in the portion without the groove 318 is smaller than the minimum distance B between the metal layers 314 and 162 in the light-emitting area EMA shown in FIG. 13.

When ESD is generated in the deposition process of the metal layer 314 and charges move along the conductive ring 300, the capacitor connected to the groove 318 in the electrostatic blocking area SBA is first exploded due to the large amount of charge. In this case, most of the charges generated due to the ESD may be dissipated, and some remaining charges may be discharged through the wiring patterns M4 and M5. As a result, when ESD is generated, charges flowing along the conductive ring 300 do not flow into the display panel, and thus do not affect the display area AA.

In addition, in the photoresist development process, the metal layer is hardly etched by a developer. For this reason, when the metal layer is present under the opening 312 of the photoresist pattern PR, as shown in FIGS. 12 and 13, more photoresists are removed from the lower end close to the metal layer such that the side surfaces of the photoresist pattern PR have an inverted tapered shape, and thus the widths of the openings 178 and 312 become narrower as the widths of the openings 178 and 312 approach the first metal layer 314. That is, the widths of the openings 178 and 312 decrease (e.g., taper) in a direction towards the first metal layer 314. In contrast, when there is no metal layer under the groove 318 of the photoresist pattern PR, as shown in FIG. 17, the photoresist pattern PR becomes tapered, for example, thicker towards the bottom, due to the isotropic removal of the photoresist from the groove 318 by the developer. Accordingly, the width of the groove 318 of the electrostatic blocking area SBA shown in FIG. 17 increases as it goes upwards, for example, as it approaches the first metal layer 314. That is, a width of the groove 318 decreases in a direction towards the first metal layer 314.

In FIG. 17, the thickness of the photoresist pattern PR and the insulating layer for the bank pattern may vary for each area on the mother substrate 1100 as shown in FIGS. 14 and 15.

According to one or more embodiments of the present disclosure, a mother substrate and a display panel using the same may be described as follows.

According to one or more embodiments of the present disclosure, a mother substrate for the display panel may include a plurality of display areas including a plurality of light-emitting areas in which light-emitting elements are to be placed, a plurality of wirings, and a plurality of pads connected to the wirings; a conductive ring disposed in a non-display area outside the display area to surround each of the display areas and electrically connected to the pad; a photoresist pattern covering the display area and the non-display area; and a first metal layer covering the photoresist pattern. The conductive ring includes an electrostatic blocking area. The electrostatic blocking area includes a second metal layer spaced apart from the first metal layer with the photoresist pattern interposed therebetween. The light-emitting area includes a third metal layer spaced apart from the first metal layer with the photoresist pattern interposed therebetween. A first distance between the first metal layer and the second metal layer disposed in the electrostatic blocking area is smaller than a second distance between the first metal layer and the third metal layer disposed in the light-emitting area.

The mother substrate may further include a shorting bar disposed in the non-display area and connected to the pads. The conductive ring may be connected to the shorting bar.

The conductive rings which are adjacent to each other may be connected to each other.

The electrostatic blocking area may include a plurality of openings through which the second metal layer is exposed. The light-emitting area may include an opening through which the third metal layer is exposed. In each of the openings of the electrostatic blocking area, the first and second metal layers may be spaced apart from each other by the first distance with air interposed therebetween. In the opening of the light-emitting area, the first and third metal layers may be spaced apart by the second distance with air therebetween.

The thickness of the photoresist pattern disposed in the electrostatic blocking area may be smaller than the thickness of the photoresist pattern disposed in the light-emitting area.

The electrostatic blocking area may include a plurality of metal layers disposed under the opening of the electrostatic blocking area. The light-emitting area may include one or more metal layers placed under the opening of the light-emitting area. The density of the metal layers disposed under the opening of the electrostatic blocking area may be greater than that of the metal layer disposed under the opening of the light-emitting area.

The metal layers placed under the opening of the electrostatic blocking area may overlap each other when viewed from the longitudinal section of the mother substrate.

The electrostatic blocking area may further include an insulating layer disposed under the second metal layer in each of the openings of the electrostatic blocking area. The light-emitting area may further include an insulating layer disposed under the third metal layer in the opening of the light-emitting area. The insulating layer in the electrostatic blocking area may be thicker than the insulating layer in the light-emitting area.

The width of each of the openings of the electrostatic blocking area and the openings of the light-emitting area may decrease as they approach the first metal layer.

The electrostatic blocking area may include a plurality of concave grooves. The second metal layer may be placed between the grooves which are adjacent to each other. The light-emitting area may include an opening through which the third metal layer is exposed. A minimum distance between the first metal layer and the second metal layer in the electrostatic blocking area may be smaller than a minimum distance between the first metal layer and the third metal layer in the light-emitting area.

The width of the groove of the electrostatic blocking area may increase as it approaches the first metal layer. The width of the opening of the light-emitting area may decrease as it approaches the first metal layer.

According to one or more embodiments of the present disclosure, the display panel may be separated from the mother substrate. The display panel may include the display area without the photoresist pattern and the first metal layer.

According to one or more embodiments of the present disclosure, the display device may be applied to mobile devices, video phones, smart watches, watch phones, wearable device, foldable device, rollable device, bendable device, flexible device, curved device, sliding device, variable device, electronic organizer, electronic books, portable multimedia players (PMPs), personal digital assistants (PDAs), MP3 players, mobile medical devices, desktop PCs, laptop PCs, netbook computers, workstations, navigations, vehicle navigations, vehicle display devices, vehicle devices, theater devices, theater display devices, televisions, wallpaper devices, signage devices, game devices, laptops, monitors, cameras, camcorders, and home appliances, etc. Additionally, the display apparatus according to one or more embodiments of the present disclosure may be applied to organic light emitting lighting devices or inorganic light emitting lighting devices.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure.

What is claimed is:

1. A mother substrate comprising:
a plurality of display areas including a plurality of light-emitting areas configured to receive light-emitting elements, a plurality of wirings, and a plurality of pads connected to the plurality of wirings;
a conductive ring in a non-display area that surrounds the plurality of display areas such that each of the plurality of display areas is surrounded by the conductive ring, the conductive ring electrically connected to the plurality of pads and including an electrostatic blocking area;
a photoresist pattern covering the plurality of display areas and the non-display area; and
a first metal layer covering the photoresist pattern,
wherein the electrostatic blocking area includes a second metal layer that is spaced apart from the first metal layer with the photoresist pattern between the first metal layer and the second metal layer, and a light-emitting area from the plurality of light-emitting areas includes a third metal layer that is spaced apart from the first metal layer with the photoresist pattern between the first metal layer and the third metal layer, and
wherein a first distance between the first metal layer and the second metal layer in the electrostatic blocking area is less than a second distance between the first metal layer and the third metal layer in the light-emitting area.

2. The mother substrate of claim 1, further comprising:
a shorting bar in the non-display area and connected to the plurality of pads, the shorting bar connected to the conductive ring.

3. The mother substrate of claim 2, wherein the conductive ring includes a first conductive ring that surrounds a first display area from the plurality of display areas and a second conductive ring that surrounds a second display area from the plurality of display areas, the first conductive ring connected to the second conductive ring.

4. The mother substrate of claim 1, wherein the electrostatic blocking area includes a plurality of openings that expose the second metal layer such that the first metal layer and the second metal layer are spaced apart from each other by the first distance with air interposed between the first metal layer and the second metal layer in each of the plurality of openings of the electrostatic blocking area,
wherein the light-emitting area includes an opening that exposes the third metal layer and the first metal layer and the third metal layer are spaced apart by the second distance with air between the first metal layer and the third metal layer in the opening of the light-emitting area.

5. The mother substrate of claim 1, wherein a second thickness of the photoresist pattern in the electrostatic blocking area is smaller than a first thickness of the photoresist pattern in the light-emitting area.

6. The mother substrate of claim 4, wherein the electrostatic blocking area includes a plurality of metal layers under the plurality of openings of the electrostatic blocking area and the light-emitting area includes one or more metal layers under the opening of the light-emitting area such that a density of the plurality of metal layers under the plurality of openings of the electrostatic blocking area is greater than a density of the one or more metal layers under the opening of the light-emitting area.

7. The mother substrate of claim 6, wherein the plurality of metal layers under the plurality of openings of the electrostatic blocking area overlap each other.

8. The mother substrate of claim 4, wherein the electrostatic blocking area further includes an insulating layer under the second metal layer in each of the plurality of openings of the electrostatic blocking area and the light-emitting area further includes an insulating layer under the third metal layer in the opening of the light-emitting area that is thinner than the insulating layer in the electrostatic blocking area.

9. The mother substrate according to claim 4, wherein a width of each of the plurality of openings of the electrostatic blocking area decreases in a direction toward the first metal layer in the electrostatic blocking area and a width of the opening of the light-emitting area decreases in the direction toward the first metal layer in the light-emitting area.

10. The mother substrate of claim 1, wherein the electrostatic blocking area includes a plurality of concave grooves and the second metal layer is between the plurality of concave grooves, and the light-emitting area includes an opening that exposes the third metal layer,
wherein a distance between a portion of the first metal layer within a concave groove from the plurality of concave grooves and the second metal layer in the electrostatic blocking area is smaller than a distance between the first metal layer and the third metal layer in the light-emitting area.

11. The mother substrate of claim 10, wherein a thickness of the photoresist pattern in the electrostatic blocking area is smaller than a thickness of the photoresist pattern disposed in the light-emitting area.

12. The mother substrate of claim 10, wherein the electrostatic blocking area further includes an insulating layer under the second metal layer in each of the plurality of concave grooves of the electrostatic blocking area and the light-emitting area further includes an insulating layer under the third metal layer in the opening of the light-emitting area that is thinner than the insulating layer in the electrostatic blocking area.

13. The mother substrate according to claim 10, wherein a width of a groove from the plurality of concave grooves in the electrostatic blocking area increases in a direction towards the first metal layer in the electrostatic blocking area, and a width of the opening of the light-emitting area decreases in the direction towards the first metal layer in the light-emitting area.

14. The mother substrate of claim 1, wherein the first metal layer and the third metal layer include a same material.

15. The mother substrate of claim 1, wherein the second metal layer is electrically connected to a base voltage source or a power wiring.

16. A mother substrate comprising:
a plurality of display areas including a plurality of light-emitting areas configured to receive light-emitting elements, a plurality of wirings, and a plurality of pads connected to the plurality of wirings;
a conductive ring in a non-display area that surrounds the plurality of display areas such that each of the plurality of display areas is surrounded by the conductive ring, the conductive ring electrically connected to the plurality of pads and including an electrostatic blocking area;
wherein the electrostatic blocking area includes a first metal layer electrically connected to a base voltage source or a power wiring, and a light-emitting area from the plurality of light-emitting areas includes a second metal layer on a same layer as the first metal layer, and
a height of a lower surface of the first metal layer is higher than a height of a lower surface of the second metal layer.

17. A mother substrate comprising:
a display area including a plurality of light-emitting areas configured to receive light-emitting elements, a plurality of wirings, and a plurality of pads connected to the plurality of wirings;
a conductive ring in a non-display area that is around the display area and connected to the plurality of pads, the conductive ring including an electrostatic blocking area;
a photoresist pattern over the display area and the electrostatic blocking area, the photoresist pattern including a first portion of the photoresist pattern having a first opening in the electrostatic blocking area and a second portion of the photoresist pattern having a second opening in a light-emitting area of the plurality of light-emitting areas;
a first metal layer including a first portion of the first metal layer over the electrostatic blocking area and a second portion of the first metal layer over the light-emitting area;
a second metal layer in the first opening in the electrostatic blocking area; and
a third metal layer in the second opening in the light-emitting area that is disconnected from the second metal layer,
wherein the second metal layer is closer to the first portion of the first metal layer than the third metal layer is to the second portion of the first metal layer.

18. The mother substrate of claim 17, wherein a thickness of the first portion of the photoresist pattern having the first opening is thinner than a thickness of the second portion of the photoresist pattern having the second opening.

19. The mother substrate of claim 18, further comprising:
a bank overlapping the second opening;
a first wiring pattern on the bank and overlapping the second opening in the light-emitting area, wherein the third metal layer contacts the first wiring pattern; and
a second wiring pattern that overlaps the first opening in the electrostatic blocking area, the second metal layer in contact with the second wiring pattern,
wherein the first wiring pattern and the second wiring pattern include a same material.

20. The mother substrate of claim 19, further comprising:
a third wiring pattern in the electrostatic blocking area;
one or more insulating layers between the third wiring pattern and the second wiring pattern in the electrostatic blocking area, wherein the third wiring pattern and the second wiring pattern are connected to each other.

21. The mother substrate of claim 17, further comprising:
an insulating layer under the second metal layer in the electrostatic blocking area and under the third metal layer in the light-emitting area such that the second metal layer and the third metal layer are on an upper surface of the insulating layer;
a plurality of metal wiring patterns overlapping the second metal layer and the first opening and the third metal layer and the second opening,
wherein a number of the plurality of metal wiring patterns overlapping the third metal layer and the second opening is less than a number of the plurality of metal wiring patterns overlapping the second metal layer and the first opening.

22. The mother substrate of claim 21, wherein an upper surface of a first portion of the insulating layer that is in contact with the second metal layer in the electrostatic blocking area is misaligned with an upper surface of a second portion of the insulating layer that is in contact with the third metal layer in the light-emitting area.

23. The mother substrate of claim 17, further comprising:
an insulating layer under the second metal layer and the third metal layer such that the second metal layer and the third metal layer are on an upper surface of the insulating layer;
wherein a thickness of a portion of the insulating layer that is under the second metal layer in the electrostatic blocking area is thicker than a thickness of a second portion of the insulating layer that is under the third metal layer in the light-emitting area.

24. The mother substrate of claim 17, further comprising:
a shorting bar in the non-display area and connected to the plurality of pads, the shorting bar connected to the conductive ring.

25. The mother substrate of claim 17, wherein a width of the first opening tapers in a direction towards the first metal layer in the electrostatic blocking area and a width of the second opening tapers in the direction towards the first metal layer in the light-emitting area.

26. The mother substrate of claim 17, wherein the second metal layer and the first portion of the first metal layer are separated from each other in the electrostatic blocking area by a first distance with air interposed between the first metal layer and the second metal layer, and the third metal layer and the second portion of the first metal layer are separated from each other in the light-emitting area by a second distance with air interposed between the first metal layer and the third metal layer,
wherein the first distance is less than the second distance.

* * * * *